US010819317B1

(12) United States Patent
Lahiri et al.

(10) Patent No.: US 10,819,317 B1
(45) Date of Patent: Oct. 27, 2020

(54) FEEDBACK STABILIZED RING OSCILLATOR

(71) Applicant: Melexis Technologies SA, Bevaix (CH)

(72) Inventors: Abhirup Lahiri, Delhi (IN); Shenjie Wang, Olten (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 16/730,474

(22) Filed: Dec. 30, 2019

(51) Int. Cl.
  *H03K 3/03* (2006.01)
  *H03F 3/45* (2006.01)

(52) U.S. Cl.
  CPC ....... *H03K 3/0322* (2013.01); *H03F 3/45475* (2013.01); *H03K 3/0307* (2013.01); *H03F 2200/129* (2013.01); *H03F 2203/45116* (2013.01); *H03F 2203/45631* (2013.01)

(58) Field of Classification Search
  CPC .................................................. H03K 3/0322
  USPC ........................................................... 331/57
  See application file for complete search history.

(56) References Cited

U.S. PATENT DOCUMENTS

| 2013/0113574 A1* | 5/2013 | Hung | H03K 3/011 331/108 R |
| 2016/0028406 A1* | 1/2016 | Kobayashi | H03K 3/011 331/57 |
| 2017/0237413 A1* | 8/2017 | Teh | H03K 3/011 331/57 |

* cited by examiner

*Primary Examiner* — Joseph Chang
(74) *Attorney, Agent, or Firm* — Workman Nydegger (57) ABSTRACT

A stabilized oscillator which comprises a ring oscillator with an odd number of inverters. The output of an inverter is driving a capacitor and the input of the a next inverter. A feedback element is configured for generating a first and a second current with a fixed current ratio between both, and for applying the same voltage over the ring oscillator as over a resistor which is connected in parallel with a current compensator. The first current goes through the parallel connection, the second current goes through the ring oscillator. The current compensator is configured such that the ratio of the current through the current compensator and a parasitic current component of the second current is substantially equal to the ratio of the first and second current.

11 Claims, 6 Drawing Sheets

FEEDBACK STABILIZED RING OSCILLATOR

FIELD OF THE INVENTION

The invention relates to the field of ring oscillators. More specifically it relates to the field of stabilized ring oscillators.

BACKGROUND OF THE INVENTION

Prior art RC oscillators (resistor capacitor oscillators) are operating by pumping current into a capacitor and charging the capacitor to a particular voltage. This voltage is compared using a comparator. As soon as the voltage across the capacitor exceeds a certain threshold, the comparator triggers the reset of the voltage across the capacitor. By doing so a waveform is created across the capacitor.

The comparator itself has a delay before triggering that the voltage over the capacitor exceeds a certain threshold. This comparator delay results in a spread in the oscillation frequency. The time constant of such an oscillator is equal to $RC+T_d$ wherein R is the resistance of the oscillator, C is the capacitor of the oscillator, and $T_d$ is the comparator delay.

For high frequency RC oscillators the comparator delay can be an important portion of the total time and therefore needs to be reduced. One way to reduce the delay is to design a faster comparator, at the expense of a higher current consumption. Such a solution is, however, not power efficient.

An issue with high frequency RC oscillators is that their oscillation frequency is sensitive to process variations, to variations in supply voltage and to variations in temperature.

Figure 1:
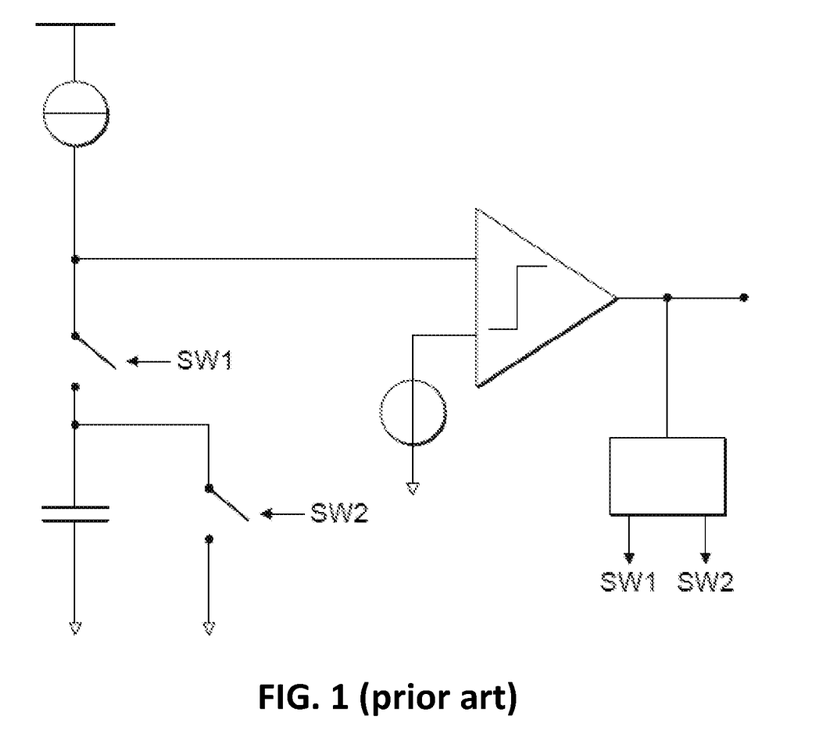
FIG. 1 shows a circuit diagram of a prior art RC oscillator.

A conventional RC oscillator design comprises a current generation circuit, a ramp generation circuit (to generate the waveform across the capacitor), and a comparator which generates feedback to reset the voltage across the capacitor. A circuit diagram of such a conventional RC oscillator is shown in FIG. 1.

Two aspects are important with respect to the comparator. One is the comparator delay, and the other is the comparator offset. An inherent static offset will result in a static error in the readout voltage. The delay of the comparator adds on to the time period as an error.

Getting rid of offset compensation may be achieved by chopping. This is achieved by alternatingly comparing the voltage on the positive terminal and the negative terminal. In one phase the offset will add up to the end result, and in the second phase it will subtract from the end result. During the overall time period the end result remains independent of the offset.

In prior art systems delay compensation is achieved by making the charging process across the capacitor inherently faster. Therefore the delay which is added to the RC delay may be sensed and this delay may be compensated by current charging the capacitor with a higher speed. Such systems have, however, an increased power consumption.

There is therefore a need for ring oscillators in which such delay problems are tackled.

SUMMARY OF THE INVENTION

It is an object of embodiments of the present invention to provide a good stabilized oscillator.

The above objective is accomplished by a method and device according to the present invention.

In a first aspect embodiments of the present invention relate to a stabilized oscillator. The stabilized oscillator comprises a ring oscillator, a feedback element, a resistor, and a current compensator. The ring oscillator comprises an odd number of inverters. These are organized in a circular chain. Per stage in the circular chain, the output of the inverter is driving a capacitor and the input of the next inverter.

The feedback element is configured for generating a first current and a second current. The second current is a supply current of the ring oscillator. The second current comprises a parasitic current which is not charging or discharging the capacitor of a stage of the ring oscillator and a functional current which is charging or discharging the capacitor of a stage of the ring oscillator, The feedback element, moreover, is configured for applying the same voltage over the ring oscillator as over the resistor. This resistor is connected in parallel with the current compensator. The feedback element is configured for generating the first current which is a supply current of the parallel connection between the resistor and the current compensator such that a fixed ratio is obtained between the first current and the second current.

The current compensator is configured such that the ratio of the current through the current compensator and the parasitic current is substantially equal to the ratio of the first current and second current.

It is an advantage of embodiments of the present invention that the ratio between the first current and the second current is fixed, and that the ratio of the current through the current compensator and the parasitic current is substantially equal to the ratio of the first current and second current. Hence, the oscillator frequency is determined by the resistance R and by the capacitance values of the capacitors C1 and is independent of the parasitic capacitances of the inverters of the ring oscillator. It is an advantage of embodiments of the present invention that a better stability of frequency over temperature can be obtained, and that a lower sensitivity of frequency to supply voltage and process tolerances is obtained. This is obtained by introducing the feedback element in combination with the resistor and the current compensator.

In embodiments of the present invention the fixed ratio between the first and the second current is equal to 1.

It is an advantage of embodiments of the present invention that the parasitic current through the ring oscillator is mimicked by the current through the current compensator. As a result thereof approximately the parasitic current of the ring oscillator is subtracted from the current through the parallel connection of the resistor and the current compensator. As a result thereof, and since the current through the ring oscillator is the same as the current through the parallel connection of the resistor and the current compensator, the current through the resistor is the approximately the same as the current for charging or discharging the capacitors C1.

The oscillator frequency is thereby determined by the resistance value R and the capacitance value C1 and is independent of the parasitic capacitances of the inverters of the ring oscillator.

In embodiments of the present invention the current compensator comprises the same number of stages as the ring oscillator. Each stage comprising an inverter, wherein each inverter of the current compensator is matched with an inverter of the ring oscillator and wherein the output of each inverter of the ring oscillator is also driving an input of an inverter in the current compensator.

In embodiments of the present invention the output of each inverter of the ring oscillator is also driving the input of an inverter of the current compensator. By doing so, the inverter stages of the current compensator are switched by the clock frequency from the ring oscillator.

It is an advantage of embodiments of the present invention that by providing matched inverters between the current compensator and the ring oscillator the parasitic current in the ring oscillator is mimicked by the current through the current compensator.

In embodiments of the present invention the inverter of a stage of the current compensator is driving an additional inverter which is not powered.

The input capacitance of the additional inverter is thereby a load for the inverter of the current compensator which is driving this additional inverter. By doing so, an inverter of the current compensator sees the same capacitance as an inverter of the ring oscillator.

In embodiments of the present invention the output of each inverter of the ring oscillator may also be driving the input of the inverter of the next stage in the current compensator.

In embodiments of the present invention the feedback element comprises an operational amplifier, a first pMOS transistor, and a second pMOS transistor.

The positive input terminal of the operational amplifier is electrically connected with the source of the first pMOS transistor.

The negative input terminal of the operational amplifier is electrically connected with the source of the second pMOS transistor.

The output terminal of the operational amplifier is electrically connected with the gates of the first and second pMOS transistors. The drains of the pMOS transistors are connected with a supply voltage line. The resistor and the current compensator are in parallel connected between the source of the first pMOS transistor and the ground. The ring oscillator is electrically connected between the source of the second pMOS transistor and the ground.

It is an advantage of embodiments of the present invention that, during operation, the voltages at the inputs of the operational amplifier are the same. Hence, the same voltage is applied over the ring oscillator as over the parallel connection of the resistor and the current compensator. It is an advantage of embodiments of the present invention that the gate source voltage is the same for both pMOS transistors. Hence, the same current flows through the ring oscillator as through the parallel connection of the resistor and the current compensator.

In embodiments of the present invention the feedback element comprises an operational amplifier, a first nMOS transistor, and a second nMOS transistor.

The positive input terminal of the operational amplifier is electrically connected with the source of the first nMOS transistor. The negative input terminal of the operational amplifier is electrically connected with the source of the second nMOS transistor wherein the first nMOS transistor is matched with the second nMOS transistor. The output terminal of the operational amplifier is electrically connected with the gates of the first and second nMOS transistors. The drains of the pMOS transistors are connected with the ground. The resistor and the current compensator are in parallel connected between the source of the first nMOS transistor and supply voltage line. The ring oscillator is electrically connected between the source of the second nMOS transistor and the ground.

In embodiments of the present invention the feedback element comprises an operational amplifier, a first resistor and a second resistor. The first resistor is connected between the negative input terminal of the operational amplifier and the output terminal of the operational amplifier, and the second resistor is connected between the positive input terminal of the operational amplifier and the output terminal of the operational amplifier. The resistance value of the first resistor is substantially the same as the resistance value of the second resistor. The resistor and the current compensator are in parallel connected between the negative input terminal of the operational amplifier and the ground. The ring oscillator is electrically connected between the between the positive input terminal of the operational amplifier and the ground.

In embodiments of the present invention the feedback element comprises a first and a second pMOS transistor with connected gates, and with their sources connected to a supply voltage line, wherein the gate of the first pMOS transistor is connected with its drain. The feedback element, moreover, comprises a first and a second nMOS transistor with connected gates, wherein the drain of the first pMOS transistor is connected with the drain of the first nMOS transistor and the drain of the second pMOS transistor is connected with the drain of the second pMOS transistor. The gate of the second nMOS transistor is connected with its drain. The source of the first nMOS transistor is connected with the parallel connection of the resistor and the current compensator and the source of the second nMOS transistor is connected with the ring oscillator.

In a second aspect embodiments of the present invention relate to a method for generating a stabilized oscillation signal. The method comprises generating a second current which is the supply current of a ring oscillator, thereby charging and discharging capacitors in the ring oscillator using a functional current and charging and discharging parasitic capacitors using a parasitic current, and a first current which is the supply current of the parallel connection of a resistor and a current compensator. The first current and the second current are generated such that they have a stable current ratio and such that the ratio of the current through the current compensator and the parasitic current is substantially equal to the ratio of the first current and the second current. While generating the currents, the same voltage is applied over the resistor as over the ring oscillator.

It is an advantage of embodiments of the present invention that the ratio of the first current and the second current is stabilized and that the ratio of the current through the current compensator and the current through the parasitic current is substantially equal to the ratio of the first current and the second current. This allows to stabilize the oscillation frequency in function of the resistance of the resistor and the capacitance of the capacitors. This oscillation frequency is not influenced by the parasitic capacitance of the inverters of the ring oscillator.

In embodiments of the present invention the first current and the second current may be substantially equal. In that case the functional current through the ring oscillator is substantially equal to the current through the resistor.

In embodiments of the present invention the method comprises driving the current compensator, which comprises the same number of stages as the ring oscillator, using outputs of inverter stages of the ring oscillator.

In embodiments of the present invention the same current through the parallel connection of the resistor and the current compensator is obtained by providing the same gate source voltage over matched transistors.

In embodiments of the present invention the same current through the parallel connection of the resistor and the current compensator is obtained by providing the same voltage over matched resistors.

In embodiments of the present invention the same voltage over the resistor as over the ring oscillator is obtained by controlling the inputs of an operational amplifier with the voltage over the ring oscillator and the voltage over the resistor, and by controlling the current through the parallel connection of the resistor and the current compensator using the output of the operational amplifier.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 2:
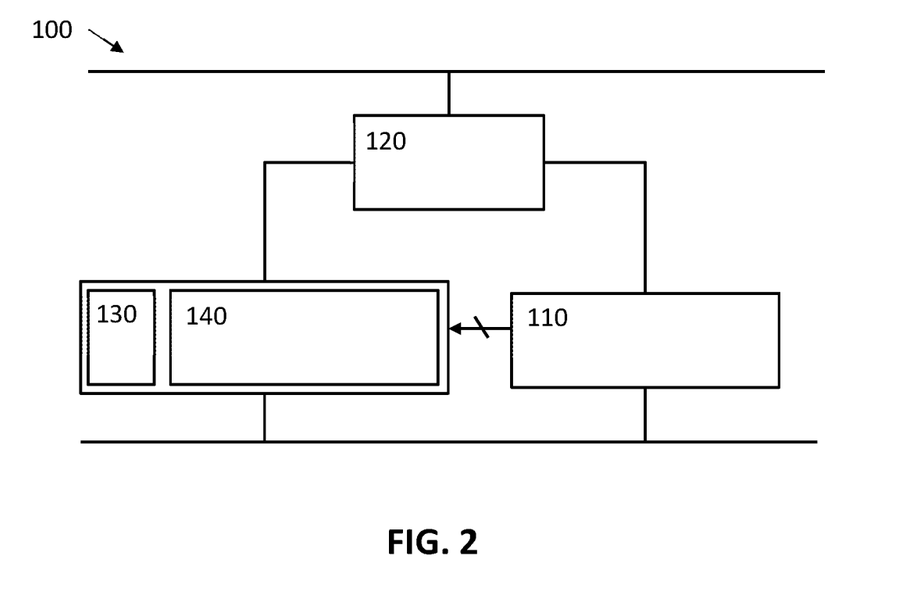
FIG. 2 shows a schematic block diagram of a stabilized oscillator in accordance with embodiments of the present invention.

In a first aspect embodiments of the present invention relate to a stabilized oscillator. A schematic block diagram of such a stabilized oscillator 100 is shown in FIG. 2. Schematic drawings of circuits of stabilized oscillators 100 in accordance with embodiments of the present invention are shown in FIGS. 3 to 7.

The stabilized oscillator 100 comprises a ring oscillator 110, a feedback element 120, a resistor 130, and a current compensator 140.

The ring oscillator 110 comprises a circular chain of an odd number of inverters 112 wherein per stage in the circular chain, the output of the inverter 112 is driving a capacitor (C1) and the input of the next inverter 112 in the circular chain.

The feedback element 120 is configured for generating a first current and a second current. The second current is a supply current of the ring oscillator 110 and comprises a parasitic current which is not charging or discharging the capacitor (C1) of a stage of the ring oscillator and a functional current which is charging or discharging the capacitor (C1) of a stage of the ring oscillator. The parasitic current comprises a static supply current of the inverters and a transient current charging or discharging the inverters parasitic capacitance.

The feedback element 120, moreover, is configured for applying the same voltage over the ring oscillator 110 as over the resistor 130 which is connected in parallel with the current compensator 140.

The feedback element 120 is, moreover, configured for generating the first current which is a supply current of the parallel connection between the resistor 130 and the current compensator 140. The feedback element is configured for generating the first current and the second current with a fixed ratio between the first current and the second current.

The current compensator 140 is configured such that the ratio of the current through the current compensator 140 and the parasitic current is substantially equal to the ratio of the first current and the second current (e.g. $I_{comp}/I_p = k$). The difference between both ratio's may for example be smaller than 10%, or even smaller than 5%, or even smaller than 1%. In embodiments of the present invention both ratio's may be equal. As a result thereof the current $I_c$ for charging or discharging the capacitors C1 is (approximately) the same as the current $I_R$ through the resistor divided by k wherein k is the fixed ratio between the first and the second current. This ratio may be equal to one.

The first current can be written as $I_1 = I_{comp} + I_R$ wherein $I_{comp}$ is the current compensator current and $I_R$ is the functional current through the resistor, and the second current can be written as $I_2 = I_p + I_C$ wherein $I_p$ is the parasitic current and $I_C$ is the current for charging or discharging the capacitors C1. The fixed ratio between the first current and the second current is k. In view of these formulas $I_{comp} + I_R = k$ ($I_p + I_C$). Hence, when $I_{comp} = k \cdot I_p$ the current $I_C$ for charging or discharging the capacitors C1 is approximately the same as the current through the resistor $I_R$ divided by k.

Hence, the oscillator frequency is determined by the resistance R and by the capacitance values of the capacitors C1 and is independent of the parasitic capacitances of the inverters of the ring oscillator. This is achieved by using the ring oscillator in a self-biased feedback loop. Unlike all precision RC oscillators, requiring explicit voltage/current reference (e.g. band-gap voltage or CTAT current generation), a stabilized oscillator according to embodiments of the present invention obviates the use of any separate reference generation.

In embodiments of the present invention the frequency of the oscillator may for example range between 10 kHz and 100 MHz, or for example between 1 MHz to 100 MHz.

The capacitors C1 not necessarily all have the same capacitance value.

Figure 3:
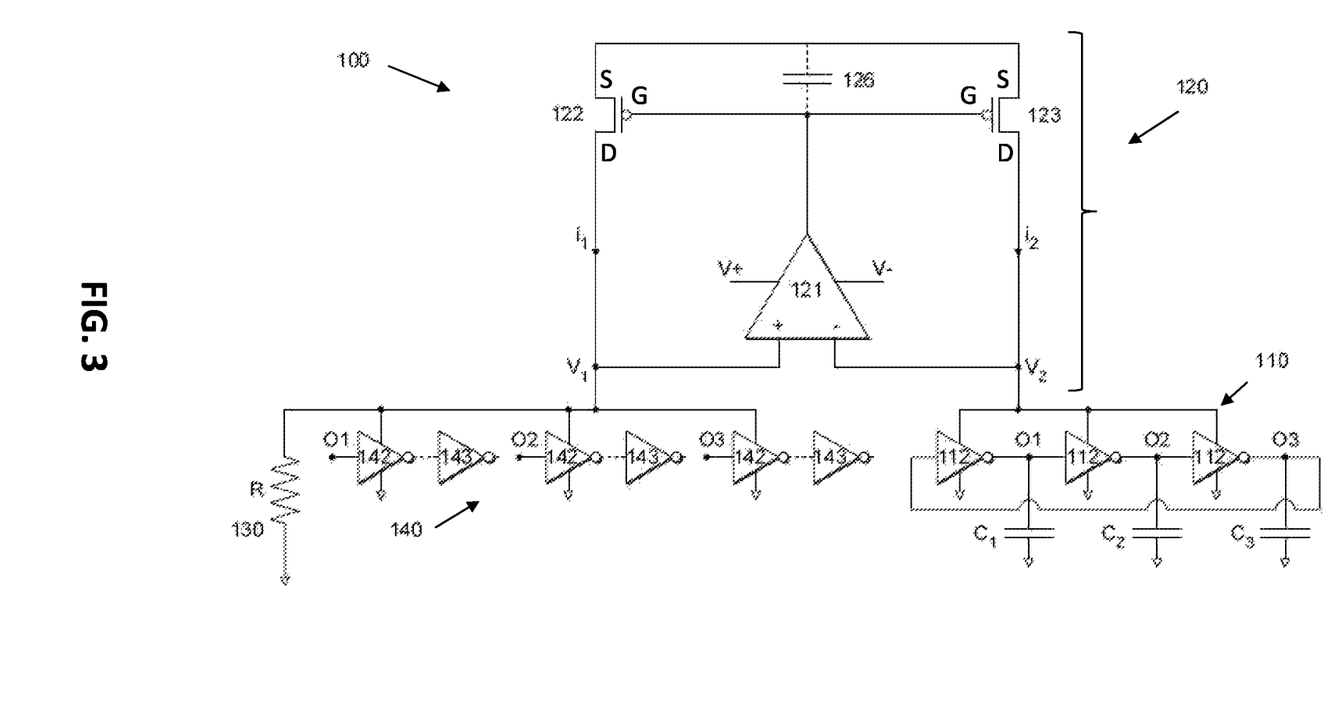
FIG. 3 shows a schematic drawing of a stabilized oscillator wherein the current compensator comprises the same number of stages as the ring oscillator, in accordance with embodiments of the present invention.

In embodiments of the present invention the current compensator 140 may comprise the same number of stages as the ring oscillator 110. An example thereof is illustrated in FIG. 3. Each inverter of the current compensator is matched with an inverter of the ring oscillator 110. The output of each inverter 112 of the ring oscillator 110 is driving the input of an inverter of the next stage in the ring oscillator such that a closed loop is formed. Besides driving the input of an inverter of the ring oscillator, the output of each inverter is also driving an input of an inverter 142 in the current compensator 140. For each stage, the inverter 142 of the current compensator 110 may be driving an additional inverter 143 not connected to the supply. In embodiments of the present invention the inverter stages are switched by the clock frequency from the ring oscillator. Thus, the transient parasitic current and the transient current through the current compensator are synchronously varying.

Figure 4:
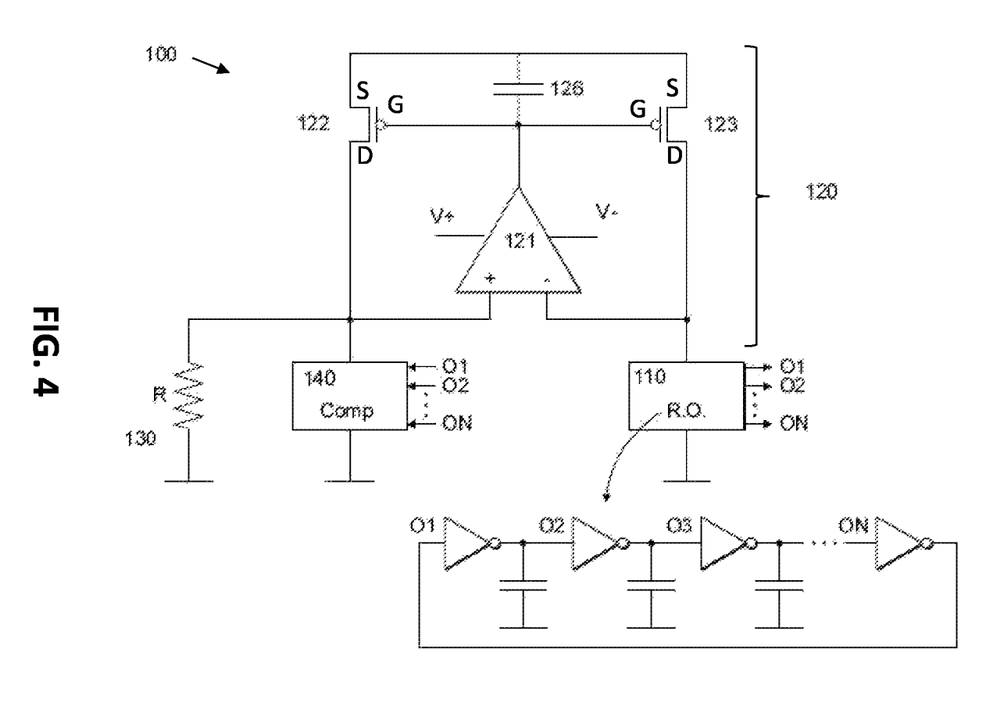
FIG. 4 shows a schematic drawing of a stabilized oscillator wherein the current compensator and the ring oscillator comprise N stages with one node per stage, in accordance with embodiments of the present invention.
Figure 5:
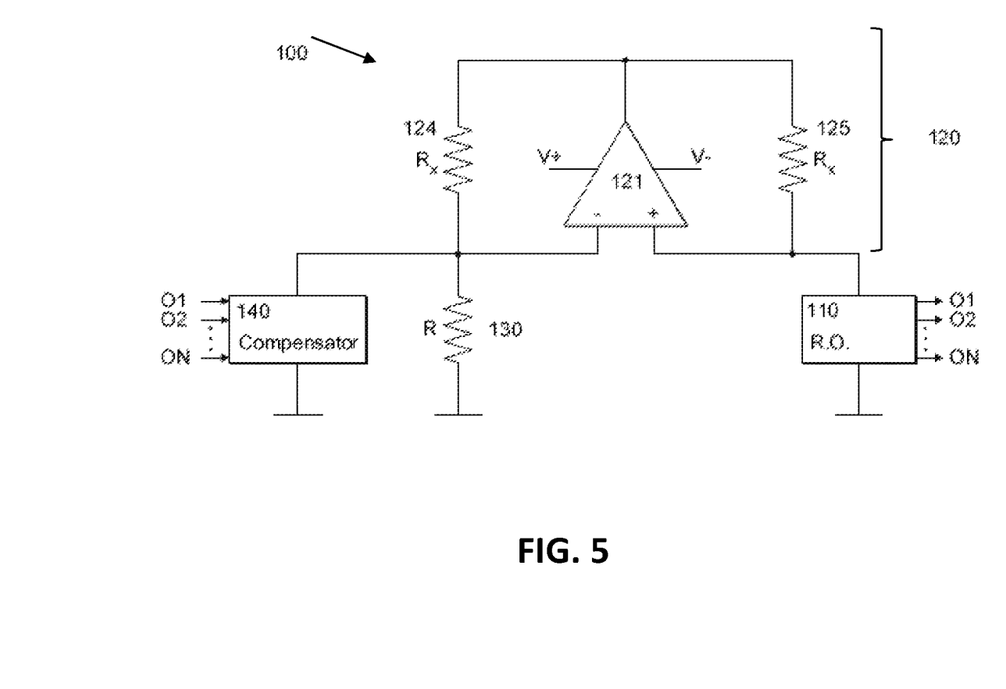
FIG. 5 shows a schematic drawing of a stabilized oscillator wherein the feedback element comprises an operational amplifier and two resistors, in accordance with embodiments of the present invention.

In the exemplary embodiments illustrated in FIG. 3 and FIG. 4 the feedback element comprises an operational amplifier 121, a first pMOS transistor 122 and a second pMOS transistor 123. These pMOS transistors 122, 123 are current sources. In this example the pMOS transistors are voltage controlled current sources. The invention is not limited to these pMOS transistors. Any current sources which are able to generate a first current and a second current, wherein the ratio between the first current and the second current is fixed, can be used.

In the exemplary embodiments illustrated in FIG. 3 and FIG. 4 the positive input terminal of the operational amplifier 121 is electrically connected with the drain D of the first pMOS transistor 122, and the negative input terminal of the operational amplifier 121 is electrically connected with the drain D of the second pMOS transistor 123, and the output terminal of the operational amplifier 121 is electrically connected with the gates G of the first and second pMOS transistors 122, 123. The operational amplifier has 2 more terminals for providing the supply voltage and the ground.

The sources S of the pMOS transistors 122, 123 are connected with a supply voltage line. The capacitor 126 between the output terminal of the operational amplifier 121 and the supply voltage line is optional. It may be added to stabilize the output of the feedback element. The resistor 130 and the current compensator 140 are in parallel connected between the drain D of the first pMOS transistor 122 and the ground. The ring oscillator 110 is electrically connected between the between the drain D of the second pMOS transistor 123 and the ground.

In the exemplary embodiments illustrated in FIG. 3 and FIG. 4 the operational amplifier locks the voltage at its positive and negative input terminals, and hence the voltage created across the resistor is locked to the supply voltage of the ring oscillator. The gate voltages of the two pMOS transistors are the same. Also the voltages on the input pins of the operational amplifier are the same. Hence, the currents through the pMOS transistors are the same (ratio k=1).

The following formulas can be derived for the current through a ring oscillator with N stages (with N odd and at least 3):

$$N \cdot i_0 + N \cdot V \cdot (C + C_p) \cdot F_{OSC}$$

With V the supply voltage, C the total capacitance of the capacitors C1 of the ring oscillator, $C_p$ the total parasitic capacitance, $F_{osc}$ the oscillation frequency, i0 the static consumption of an inverter stage and R the resistance of the resistor 130.

The current through the parallel connection between the current compensator and the resistor is the following:

$$N * i_0 + N * V * C_p * F_{OSC} + \frac{V}{R}$$

As the current through the parallel connection of the resistor and the current compensator is the same as the current through the ring oscillator, the following equation holds:

$$N * i_0 + N * V * (C + C_p) * F_{OSC} = N * i_0 N * V * C_p * F_{OSC} + \frac{V}{R}$$

a. $F_{OSC} = \dfrac{1}{N * R * C}$

In the examples of FIG. 3 and FIG. 4 the voltage created across the resistor is duplicated across the ring oscillator by means of the operational amplifier 121. By doing so, no additional current sources or precise voltages are needed and a self-biasing scheme is obtained.

One of the sources of an error is that every ring oscillator stage not only needs to drive the capacitor C1 but also its own parasitic capacitance. Therefore the current through the top pMOS device 123 is not only a function of the capacitor C1, but also a function of the parasitic capacitance. It is an advantage of embodiments of the present invention that the time period of the oscillation can be made independent of the parasitic capacitance.

To achieve this, the oscillator comprises the current compensator. In the example the current compensator comprises three stages. These are not loaded with the capacitor C1 but drive their own capacitance. The transistors of the ring oscillator and those of the current compensator are made using the same process, hence process variations in the parasitic capacitances will be the same for the transistors of the ring oscillator and as those of the current compensator. As a result the parasitic switching current of the ring oscillator is the same as the switching current through the current compensator.

In the schematic drawing of FIG. 3 the inverters 142, 143 of the current compensator are shown. Every inverter is loaded with another inverter stage. The inverters 112 of the ring oscillator are driving their own capacitor and the capacitor of the inverter of the next stage. The output of each inverter 112 of the ring oscillator 110 is also driving an input of the inverter 142 of the current compensator. This is indicated by the nodes O1, O2 and O3 of the capacitors of the ring oscillator which are also present at the inputs of the inverters 142 of the current compensator. In FIG. 3 the loads of the nodes of the ring oscillator 110 are mimicked by the stages of the current compensator 140. The structure of the current compensator does not necessarily need to be exact the same structure as the structure of the ring oscillator (see e.g. FIG. 4), as long as the static current and parasitic switching currents in the ring oscillator, or a ratio thereof, are emulated by the current in the current compensator.

The parasitic capacitance of the current compensator can be designed such that the parasitic current through the ring oscillator is the same as the current through the current compensator. In that case the current through the resistor is the same as the current through the ring oscillator which is charging or discharging the capacitors C1.

In embodiments of the present invention the inverters of the ring oscillator and the inverters of the current compensator may be switching at the same rate (e.g. 30 MHz). The capacitance of the C1 capacitor is typically 10 times to 20 times the value of the parasitic capacitors. This C1 capacitance can be lowered for increasing the frequency. It is an advantage of embodiments of the present invention that this is possible without being disturbed by the influence of the parasitic capacitances because of the presence of the current compensator. Thus a robust, more precise system can be obtained.

The systems illustrated in FIG. 3 and FIG. 4 may be flipped. In that case the ring oscillator 110 and the current compensator 140 are electrically connected between the supply voltage and the inputs of the operational amplifier while the output of the operational amplifier is connected with the gates of nMOS transistors at the bottom. These nMOS transistors are giving the current to the resistor and the ring oscillator. One nMOS transistor is connected between the ring oscillator and the ground, and another nMOS transistor is connected between the ground and the parallel connection of the resistor and the current compensator In another exemplary embodiment of the present invention, illustrated in FIG. 5, the feedback element 120 comprises an operational amplifier 121, a first resistor 124 and a second resistor 125. In this example the voltages across the resistor 130 and the ring oscillator 110 are locked. In this example it is also ensured that the same current flows through the resistor 130 in parallel with the current compensator 140 and through the ring oscillator 110. This is achieved by providing the first resistor between the negative input terminal of the operational amplifier 121 and the output terminal of the operational amplifier 121, and the second resistor 125 between the positive input terminal of the operational amplifier 121 and the output terminal of the operational amplifier 121. When both resistors have the same value, and one node is common between both and the top node is the same, the current through both resistors will be the same because the operational amplifier 121 locks the voltage on the other nodes of the resistors.

Figure 6:
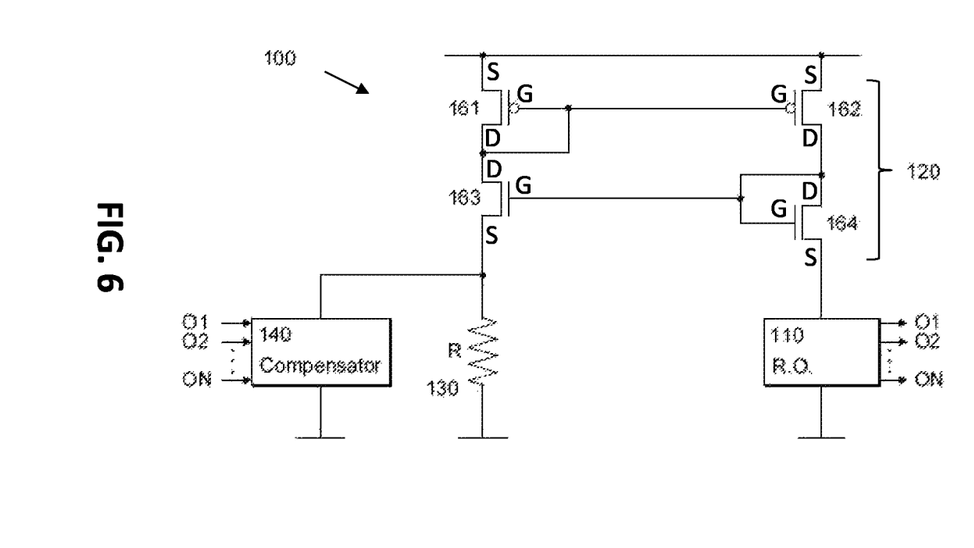
FIG. 6 shows a schematic drawing of a stabilized oscillator comprises two nMOS transistors and two pMOS transistors for locking the voltages and copying the current flow, in accordance with embodiments of the present invention.

In another exemplary embodiment of the present invention, in stead of using an operational amplifier, a simpler structure can be used. Such a structure is illustrated in FIG. 6.

In this example a first pMOS transistor 161 and a second pMOS transistor 162 have connected gates G. The gate G of the first pMOS transistor 161 is connected with its drain D.

The structure, moreover, comprises a first nMOS transistor 163 and a second nMOS transistor 164 with connected gates.

The first pMOS transistor 161 is connected between the supply voltage line and the first nMOS transistor 163. The second pMOS transistor 162 is connected between the supply voltage line and the second nMOS transistor 164. The gate G of the second nMOS transistor 164 is connected with its drain D.

The parallel connection of the resistor 130 and the current compensator 140 is connected between the first nMOS transistor 163 and the ground. The ring oscillator 110 is connected between the second nMOS transistor 164 and the ground.

The two nMOS transistors 163, 164 and the two pMOS transistors 161, 162 lock the voltages and insure that the same current flows through both branches by means of a current mirror shown at the top. The nMOS transistors 163, 164 at the bottom create the same voltage across the resistor and the ring oscillator.

Figure 7:
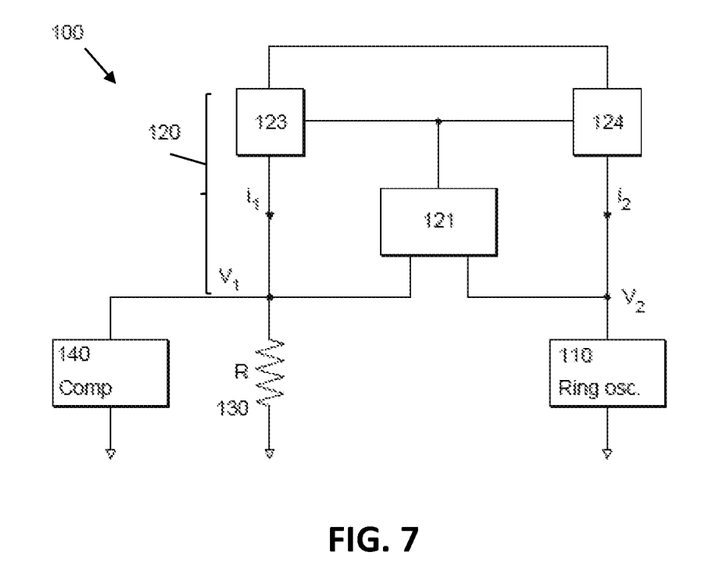
FIG. 7 shows a generic schematic drawing of a stabilized oscillator in accordance with embodiments of the present invention.

FIG. 7 shows a generic schematic drawing of a stabilized oscillator in accordance with embodiments of the present invention. As illustrated in this figure any feedback element which locks the voltages while insuring a fixed current ratio between the current through the current oscillator and the current through the parallel connection of the resistor and the current compensator can be used. In this example the current sources 123, 124 may be digitally controlled current sources and the feedback element 120 may comprise a controller 121 which is configured for acting on the digitally controller current sources in order to stabilize the voltages.

It is an advantage of embodiments of the present invention that no high frequency system closed by a comparator is required. Moreover, no bandgap voltage is needed. In prior art RC oscillators a reference current and a reference voltage is required while in the present invention the feedback loop is self-biased. Because of the intrinsic regulation of this device, no extra voltage regulation is needed.

In a second aspect embodiments of the present invention relate to a method for generating a stabilized oscillation signal. The method comprises generating a second current which is the supply current of a ring oscillator, thereby charging and discharging capacitors in the ring oscillator using a functional current and charging and discharging parasitic capacitors using a parasitic current. The method, moreover, comprises generating a first current which is the supply current of the parallel connection of a resistor and a current compensator.

The first current and the second current are generated such that they have a stable current ratio. The ratio of the current through the current compensator and the parasitic current is substantially equal to the ratio of the first current and second current. While generating the currents, the same voltage is present over the resistor as over the ring oscillator.

The invention claimed is:

1. A stabilized oscillator, the stabilized oscillator comprising a ring oscillator, a feedback element, a resistor, and a current compensator;
    the ring oscillator comprises an odd number of inverters, wherein per stage, the output of the inverter is driving a capacitor and the input of the next inverter;
    the feedback element is configured for generating a first current and a second current, wherein the second current is a supply current of the ring oscillator and comprises a parasitic current which is not charging or discharging the capacitor of a stage of the ring oscillator and a functional current which is charging or discharging the capacitor of a stage of the ring oscillator;
    the feedback element, moreover, is configured for applying the same voltage over the ring oscillator as over the resistor which is connected in parallel with the current compensator and for generating the first current, which is a supply current of the parallel connection between the resistor and the current compensator, such that a fixed ratio is obtained between the first current and the second current; and
    the current compensator is configured such that the ratio of the current through the current compensator and the parasitic current is substantially equal to the ratio of the first current and second current;
    wherein the current compensator comprises the same number of stages as the ring oscillator, each stage comprising an inverter, wherein each inverter of the current compensator is matched with an inverter of the ring oscillator, and wherein the output of each inverter of the ring oscillator is also driving an input of an inverter in the current compensator.

2. The stabilized oscillator according to claim 1, wherein the fixed ratio between the first and the second current is equal to 1.

3. The stabilized oscillator according to claim 1, wherein per stage the inverter of the current compensator is driving an additional inverter which is not powered.

4. The stabilized oscillator, according to claim 1, wherein the feedback element comprises an operational amplifier, a first pMOS transistor, and a second pMOS transistor;
    wherein the positive input terminal of the operational amplifier is electrically connected with the source of the first pMOS transistor; and
    wherein the negative input terminal of the operational amplifier is electrically connected with the source of the second pMOS transistor; and
    wherein the output terminal of the operational amplifier is electrically connected with the gates of the first and second pMOS transistors; and
    wherein the sources of the pMOS transistors are connected with a supply voltage line; and
    wherein the resistor and the current compensator are in parallel connected between the drain of the first pMOS transistor and the ground; and
    wherein the ring oscillator is electrically connected between the drain of the second pMOS transistor and the ground.

5. The stabilized oscillator, according to claim 1, wherein the feedback element comprises an operational amplifier, a first nMOS transistor, and a second nMOS transistor;
    wherein the positive input terminal of the operational amplifier is electrically connected with the source of the first nMOS transistor; and
    wherein the negative input terminal of the operational amplifier is electrically connected with the source of the second nMOS transistor wherein the first nMOS transistor is matched with the second nMOS transistor; and
    wherein the output terminal of the operational amplifier is electrically connected with the gates of the first and second nMOS transistors; and
    wherein the drains of the nMOS transistors are connected with the ground; and
    wherein the resistor and the current compensator are in parallel connected between the source of the first nMOS transistor and supply voltage line; and
    wherein the ring oscillator is electrically connected between the between the source of the second nMOS transistor and the ground.

6. The stabilized oscillator, according to claim 1, wherein the feedback element comprises an operational amplifier, a first resistor and a second resistor;
    wherein the first resistor is connected between the negative input terminal of the operational amplifier and the output terminal of the operational amplifier, and wherein the second resistor is connected between the positive input terminal of the operational amplifier and the output terminal of the operational amplifier, wherein the resistance value of the first resistor is substantially the same as the resistance value of the second resistor; and
    wherein the resistor and the current compensator are in parallel connected between the negative input terminal of the operational amplifier and the ground; and wherein the ring oscillator is electrically connected between the between the positive input terminal of the operational amplifier and the ground.

7. The stabilized oscillator, according to claim 1, wherein the feedback element comprises:
   a first and a second pMOS transistor with connected gates, and with their sources connected to a supply voltage line, wherein the gate of the first pMOS transistor is connected with its drain;
   a first and a second nMOS transistor with connected gates, and wherein the drain of the first pMOS transistor is connected with the drain of the first nMOS transistor and the drain of the second pMOS transistor is connected with the drain of the second pMOS transistor, wherein the gate of the second nMOS transistor is connected with its drain; and
   wherein the source of the first nMOS transistor is connected with the parallel connection of the resistor and the current compensator and the source of the second nMOS transistor is connected with the ring oscillator.

8. A method for generating a stabilized oscillation signal, the method comprising:
   generating a second current which is the supply current of a ring oscillator, thereby charging and discharging capacitors in the ring oscillator using a functional current and charging and discharging parasitic capacitors using a parasitic current, and a first current which is the supply current of the parallel connection of a resistor and a current compensator;
   while stabilizing a current ratio of the first current and the second current, wherein the ratio of the current through the current compensator and the parasitic current is substantially equal to the ratio of the first current and the second current; and
   while applying the same voltage over the resistor as over the ring oscillator;
   the method comprising driving the current compensator, which comprises the same number of stages as the ring oscillator, using outputs of inverter stages of the ring oscillator.

9. The method according to claim 8, wherein the same current through the parallel connection of the resistor and the current compensator is obtained by providing the same gate source voltage over matched transistors.

10. The method according to claim 8, wherein the same current through the parallel connection of the resistor and the current compensator is obtained by providing the same voltage over matched resistors.

11. The method according to claim 8, wherein the same voltage over the resistor as over the ring oscillator is obtained by controlling the inputs of an operational amplifier with the voltage over the ring oscillator and the voltage over the resistor, and by controlling the current through the parallel connection of the resistor and the current compensator using the output of the operational amplifier.

* * * * *